United States Patent [19]

Park

[11] Patent Number: 5,519,325
[45] Date of Patent: May 21, 1996

[54] MEASURING APPARATUS FOR A PASSIVE ELEMENT VALUE USING A CURRENT VECTOR

[75] Inventor: Sang-Gon Park, Seoul, Rep. of Korea

[73] Assignee: Samsung Electronics Co., Ltd., Suwon City, Rep. of Korea

[21] Appl. No.: 99,442

[22] Filed: Jul. 30, 1993

[30] Foreign Application Priority Data

Aug. 4, 1992 [KR] Rep. of Korea ............... 92-14011

[51] Int. Cl.[6] ........................... G01R 23/16; G01R 27/28
[52] U.S. Cl. ...................................... 324/607; 324/650
[58] Field of Search ............................. 324/607, 603, 324/650, 73.1

[56] References Cited

U.S. PATENT DOCUMENTS

| | | | |
|---|---|---|---|
| 4,409,543 | 10/1983 | Sugihara | 324/607 |
| 4,481,464 | 11/1984 | Noguchi | 324/607 |
| 4,935,692 | 6/1990 | Wakasugi | 324/607 |
| 4,947,130 | 8/1990 | Kitayoshi | 324/607 |
| 5,019,781 | 5/1991 | Tanimoto | 324/607 |

Primary Examiner—Kenneth A. Wieder
Assistant Examiner—Jose M. Solis
Attorney, Agent, or Firm—Burns, Doane, Swecker & Mathis

[57] ABSTRACT

The present invention relates to a measuring apparatus for a passive element value using a current vector in which a passive element value is measured by detection of the voltage vector drops at both ends of the passive element and current vectors flowing through the passive element when since waves are applied. The sine wave oscillator applies to a passive measuring element sine waves having a constant maximum value and a constant frequency, and a voltage detecting unit detect a voltage vector drop at the passive measuring element when the sine waves are applied. A current detecting unit then detects a current vector flowing through the passive measuring element, a multiplying circuit unit multiplies an output of the voltage detecting unit to that of the current detecting unit to thereby detect a phase difference between the voltage and the current, and a microcomputer performs an operational process on the passive element value with the voltage vector, current vector and the phase as variables.

3 Claims, 1 Drawing Sheet

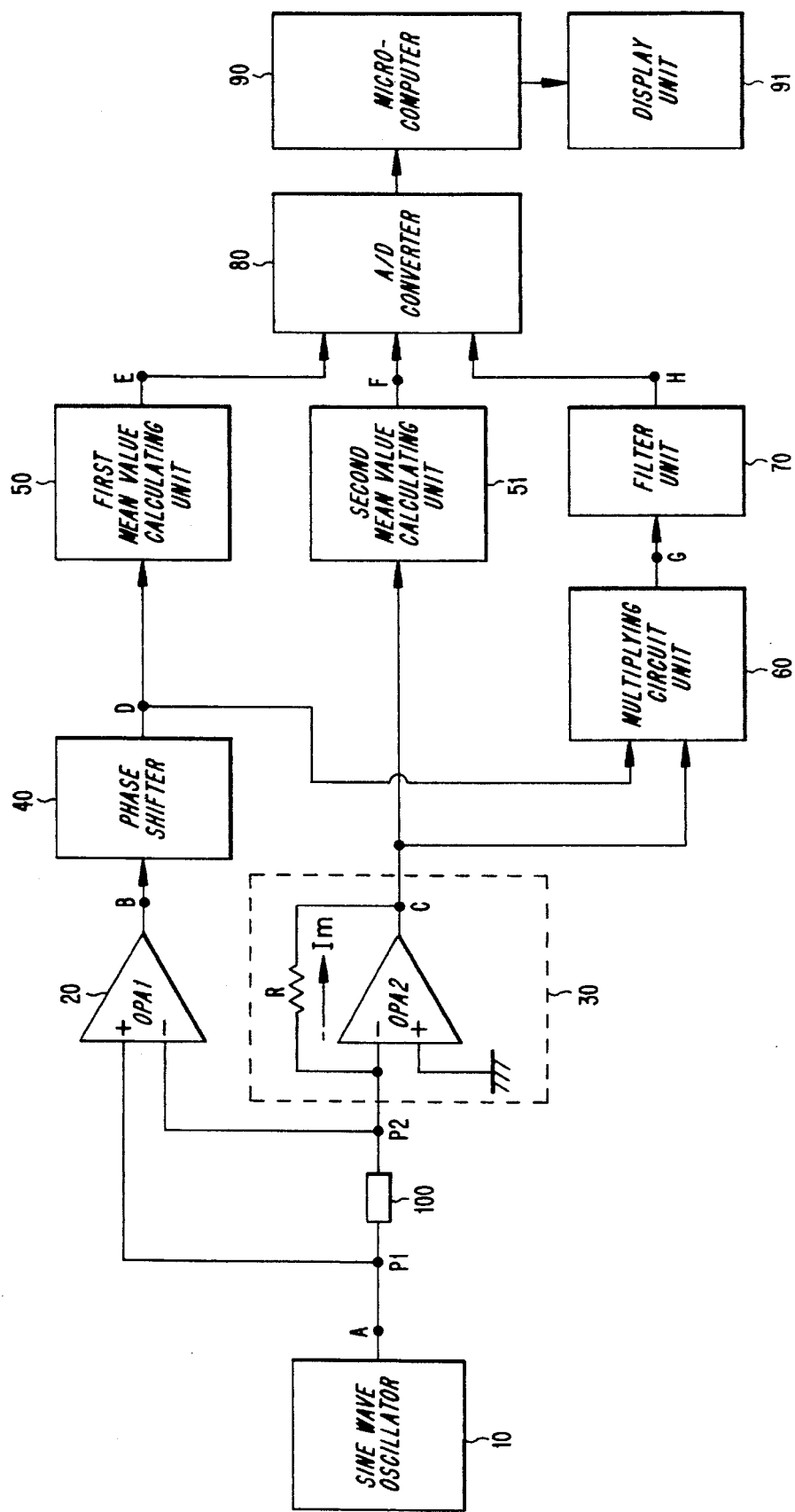

MEASURING APPARATUS FOR A PASSIVE ELEMENT VALUE USING A CURRENT VECTOR

BACKGROUND OF THE INVENTION

1. Field of the Invention

The present invention relates to a measuring apparatus for a passive element value using a current vector in which a passive element value is measured by the detection of the voltage vector drop at both ends of the passive element and current vectors flowing through the passive element when sine waves are applied.

2. Description of the Prior Art

Conventionally, the passive element value of a resistor, inductor, capacitor or the like has been measured by gain which varies according to the values of the passive elements or by a method of detecting changed characteristics thereof.

These kind of conventional measuring methods can have relatively accurate measurements in the case of measuring one element out of such elements as the resistor, inductor or capacitor. However, in the case of serial and parallel circuits comprising at least more than 2 kinds of passive elements, there arises a phase difference between the current and voltage. When the element value is measured by either one of current or voltage parameters, huge measuring errors are generated. Further, when an inductor element value is large, it is impossible to measure in itself due to generation of a reverse electromotive force.

Furthermore, when more than two kinds of elements are connected in a serial or parallel construction, it is impossible to measure more than two kinds of elements at the same time due to the above reason, that is, one of the kinds of elements is measured first and then the other kinds of elements are measured in sequence.

In other words, when a circuit connected in series with such two elements as resistor and capacitor, resistor and inductor, or capacitor and inductor, and the like, is measured by an impedance measuring method, it is difficult to distinguish respective element values because a combined impedance for the two kinds of elements is measured.

Therefore, in the case of a parallel circuit comprising two kinds of elements, the elements have to be measured individually.

By way of example, in case of a parallel circuit comprising a resistor and a capacitor, a constant current is applied to the parallel circuit via a measuring apparatus. The capacitor is thereby charged and the influence of the capacitor on the resistor is minimized, so that a voltage drop at the resistor is detected to thereby measure a resistor value, that is, an impedance.

Furthermore, apart from the resistor, a capacitor value, that is, a capacitance, is measured by utilizing a time constant wherein the capacitor is charged.

As seen from the foregoing, the resistance and capacitance are respectively measured by separate methods.

Specifically in case of a capacitor with a large capacity, it takes lots of time to charge, which inevitably causes a long time to measure.

Still furthermore, all the passive elements thus mentioned contain other characteristics in addition to basic characteristics intrinsic to the element.

In other words, a resistor basically has a resistant component expressed in the resistance. However, in a strict sense, a resistor contains an inductor or capacitor component at the same time in addition to the resistent component, and the same case applies to the inductor or the capacitor.

In this sense, the conventional measuring method has had a problem in that an accurate measurement can not be realized because the influences of the components other than the basic component have been disregarded in the measurement.

Accordingly, the present invention has been provided to solve the conventional problems, and it is an object of the present invention to provide a measuring apparatus for a passive element value using a current vector in which respective element values contained in the passive measuring element are measured by the detection of current vectors output during an application of sine waves to the passive measuring element.

It is another object of the present invention to provide a measuring apparatus for a passive element value in a serial or parallel circuit comprising more than two kinds of passive elements by which the passive element values thereof can be measured at the same time.

SUMMARY OF THE INVENTION

In accordance with the objects of the present invention, there is provided a measuring apparatus for a passive element value using a current vector, the apparatus comprising: a sine wave oscillator for supplying to the passive measuring element a sine wave having a constant maximum value and frequency; a voltage detecting unit for detecting a voltage vector drop at the passive measuring element when the sine wave is applied; a current detecting unit for detecting a current vector flowing through the passive measuring element when the sine wave is applied; a phase shifter for shifting a voltage phase output from the voltage detecting unit; a multiplying circuit unit for multiplying an output of the current detecting unit by that of the phase shifter in order to calculate a phase difference between the voltage and current; a first mean value calculating unit for calculating a mean value of the voltage output from the phase shifter; a second mean value calculating unit for calculating a mean value of the voltage output from the current detecting unit; a filter unit for filtering the multiplying circuit unit in order to obtain a direct current component from an output of the multiplying circuit unit; an analog-to-digital converter for converting the respective outputs of the first and second mean value calculating units and output of the filter to digital signals; a microcomputer for performing an operational process on the digital signals output from the analog-to-digital converter; and a display unit for displaying a result operationally processed at the microcomputer.

BRIEF DESCRIPTION OF THE DRAWINGS

Other object and aspects of the invention will become apparent from the following description of embodiments with reference to the accompanying drawings in which:

The sole FIGURE depicts an overall block diagram of a measuring apparatus for a passive element value using a current vector in accordance with the present invention.

DETAILED DESCRIPTION OF THE INVENTION

Hereinafter, an embodiment of the present invention will be described in detail with reference to accompanying drawing.

In the drawing, a reference numeral 10 is a sine wave oscillator for generating a sine wave A having a constant maximum value and a constant frequency in order to detect a current vector flowing through a passive measuring element 100 which is an object to be measured. The formula of the sine wave A can be defined as follows:

$$A = Em \sin \omega t.$$

In the above formula, Em is a voltage maximum value and ω represents the angular frequency. The passive measuring element 100 is connected in parallel with a voltage detecting unit 20 comprising a differential amplifier OPA1 for detecting voltage drops at either ends P1 and P2 of the element 100. In other words, in the voltage detecting unit 20, the differential amplifier OPA1 has a non-inverting terminal (+) connected to a terminal p1 to which the sine wave signal A is applied, and has an inverting terminal(−) connected to a terminal P2.

The differential amplifier OPA1 amplifies the difference between the output A applied to the terminal P1 and the voltage of the terminal P2 to thereby produce an output B. The formula for B is as follows.

$$B = Vm \sin \omega t$$

In the output B, a reference Vm represents a maximum voltage drop at the passive measuring element.

An output terminal of the sine wave oscillator 10 is connected serially to a current detecting unit 30 comprising a differential amplifier OPA2 via the passive measuring element 100.

In other words, in the current detecting unit 30, the differential amplifier OPA2 has an inverting terminal(−) connected to the passive measuring element 100, and has a non-inverting terminal(+) connected to ground. Between the output terminal and the inverting terminal(−) a negative feedback loop is formed via a medium of a resistor R.

The differential amplifier OPA2 exhibits a phase difference between a voltage drop at either ends of the passive measuring element 100 and detects a current flowing through the passive measuring element 100, and produces an output C which is a multiplication of the resistor R formed on the feedback loop and the detected current having a phase difference. The formula of the output C is as follows:

$$C = -Im \times R \times \sin(\omega t - \theta)$$

In the output C, θ represents a phase difference, and a negative rendition(−) defines that a current Im flows reversely against the feedback direction.

An output terminal of the voltage detecting unit 20 is connected to a phase shifter 40, which is in turn connected to a first input terminal of a first mean value calculating unit 50 and a multiplying circuit unit 60.

The phase shifter 40 shifts by 90 degrees a phase of the output B produced from the voltage detecting unit 20 in order to synchronize with the sine waves output from the current detecting unit 30 and other cosine waves. In this way an output D which is a sine wave of the output B converted to a cosine wave can be applied to the first mean value calculating unit 50.

The output D is as follows:

$$D = Vm \sin(\omega t + \pi/2) = Vm \cos \omega t.$$

The first mean value calculating unit 50 into which the output D has been input calculates a mean value of the output D, which used as a variable of a microcomputer (explained later).

A mean value of the cosine wave is 2/π times the maximum value and an output E of the first calculating unit 50 becomes as below:

$$E = Vm \times 2/\pi$$

The output E is an analog signal which is converted to a digital signal at the analog-to-digital converter 80 in order to be input into the microcomputer 90 as a variable value.

Meanwhile, an output terminal of the current detecting unit 30 is connected to a second input terminal of the second mean value calculating unit 50 and the multiplying circuit unit 60.

The second mean value calculating unit 51 calculates a mean value of the output C produced from the current detecting unit 30, and the calculated mean value is used as a variable in the microcomputer 90 (explained later).

The mean value of the sine wave is 2/π times the maximum value, which makes an output F of the second calculating unit 51 read as follows:

$$F = -Im R \times 2/\pi$$

The output F is converted to a digital signal at the converter 80 to be input into the microcomputer 90 as a variable value.

Meanwhile the multiplying circuit 60 multiplies the outputs C and D input through the first and second input terminals and outputs a following output G to a low pass filter unit 70, so that the phase difference between voltage and current can be obtained.

An output G is as follows:

$$\begin{aligned} G &= C \times D \\ &= -Im\, R \sin(\omega t - \theta) \times Vm v \cos \omega t \\ &= -Vm\, Im\, R/2[\sin(-\theta) + \sin(2\omega t + \theta)] \\ &= 1/2\, Vm\, Im\, R \sin\theta - 1/2\, Vm\, Im\, R \sin(2\omega t + \theta) \end{aligned}$$

The output G of the multiplying circuit unit is input to the filter unit 70 which eliminates an alternating current component out of the output G and instead outputs only a direct current component to the converter 80.

In other words, an output H only corresponding to a constant component out of the output G is output to the converter 80.

The output H reads as follows:

$$H = 1/2 Vm\, Im\, R \sin \theta$$

As seen from the foregoing, the outputs E and F respectively produced from the first and second calculating units 50 and 51 plus the output H of the low pass filter unit 70 are all analog signals which are converted to digital values by the analog-to-digital converter 80 in order that these variables can be input as operators of the microcomputer 90.

The digital variable values are calculated in values of the passive measuring element through the following processes.

The microcomputer 90 performs an operation on the following voltage Vm out of the output E produced from the first calculating unit 50.

$$Vm = E \times \pi/2$$

The microcomputer 90 also performs an operation on the following current Im out of the output F produced from the second calculating unit 51.

$$Im = -F \times \pi/2$$

The phase difference obtained from the output H produced from the low filter unit 70 can be defined as below:

$$\sin\theta = 2 \times H(Vm \times Im \times R)$$
$$= -8H/(\pi^2 E \times F \times R)$$
$$\theta = \sin^{-1}[-8H/(\pi^2 E \times F \times R)]$$

Generally speaking, the voltage, current and impedance represented in vector form can be read as follows:

$$\overline{Z} = \overline{V}/\overline{I} \quad (1)$$
$$= \frac{Vm}{Im} < \theta$$
$$= Zr + Zij \text{ (whereas } j = \sqrt{-1}\text{ )}$$

Zr in the above formula can be defined as follows:

$$Zr = Vm/(Im \cos\theta)$$
$$= -E/(F \cos\theta)$$

Zi in the above formula can be expressed as follows:

$$Zi = Vm/(Im \sin\theta) \quad (2)$$
$$= -E/(F \sin\theta)$$

The formula wherein the passive measuring element is in parallel with a resistor and a coil can be seen as follows:

$$\overline{Z} = Zr + Zij$$
$$= R//j\omega L$$
$$= R \times j\omega L/(R + j\omega L)$$

R and wL can be given in Zr and Zi as follows:

$$R = (Zr^2 + Zi^2)/Zr$$
$$wL = (Zr^2 + Zi^2)/Zi$$
$$L = (Zr^2 + Zi^2)/(\omega Zi) \quad (3)$$

In the above formula (3), the values of the resistor and the coil can be obtained by substituting "$-E/(F \cos\theta)$" in case of Zr as in the formula (1) and by substituting "$-E/(F \sin\theta)$" in case of Zi as in the formula (2).

In FIG. 1, a formula wherein the passive measuring element 100 comprises a pure resistor can be expressed as follows:

$$\theta = 0 \quad (4)$$
$$R = Zr$$
$$= -E/F$$

In the above formula (4), variables E and F correspond to output values of the first and second calculating units 50 and 51.

A formula wherein the passive measuring element comprises a pure coil can be seen as follows:

$$\theta = \pi/2 \quad (5)$$
$$Zi = \omega L$$
$$L = Zi/\omega$$
$$= E/(2\pi f \times F)$$

In the above formula (5), the frequency f corresponds to a frequency of the sine wave form output from the sine wave oscillator 10.

A formula wherein the passive measuring element comprises a pure condenser can be represented as follows:

$$\theta = -\pi/2 \quad (6)$$
$$Zi = -1/\omega L$$
$$L = Zi/\omega$$
$$= E/(2\pi f \times F)$$

In the above formula (6), the frequency f corresponds to a frequency of the sine wave form output from the sine wave oscillator 10.

The formula wherein the passive measuring element 100 comprises a pure condenser can be given as follows:

$$\theta = -\pi/2$$

$$Zi = -1/\omega L$$

$$C = -1/(Zi \times \omega)$$

The formula wherein the passive measuring element 100 is in parallel with a resistor and a condenser can be specified as below:

$$\overline{Z} = Zr + Zij$$
$$= R// -\left(\frac{1}{\omega c}\right)$$
$$= R \times \left[ -j\frac{1}{\omega c} / \left(R - j\frac{1}{\omega c}\right) \right]$$

If R and $1/\omega c$ are given in Zr and Zi, $$R = (Zr^2 + Zi^2)/Zr$$

$$-1/\omega c = (Zr^2 + Zi^2)/Zi$$

whereas $$C = Zi/(Zr^2 + Zi^2)\omega \quad (7)$$

As in the formula (3), values of the resistor and the condenser can be obtained by substituting "$Zr = -E/(F \cos\theta)$, $Zi = -E/(F \sin\theta)$" to the formula (7).

The microcomputer 90 calculates a value of the passive element comprising the passive measuring element 100, in other words, calculates resistance, inductance or capacitance, and outputs the calculated values to a display unit 91.

The display unit 91 displays the values calculated by the microcomputer 90, so that the display unit 91 can be confirmed by a user's eyes.

As seen from the foregoing, a measuring apparatus for passive element value using a current vector in accordance with the present invention applies sine waves to a to-be-measured resistor, inductor and/or capacitor to thereby measure a current vector and calculate a phase difference between the voltage and the current vector, so that a resistance of the passive measuring element as well as values for inductance and capacitance can be accurately measured.

Furthermore, there is an effect of measuring at the same time respective element values even in serial and parallel circuits comprising more than two kinds of passive elements.

What is claimed is:

1. A measuring apparatus for measuring a value of at least one passive element value using a current vector, comprising:

a sine wave oscillator for supplying a sine wave having a constant voltage amplitude and frequency to the passive element;

a voltage detecting unit for detecting a voltage drop across the passive element where the sine wave is applied, said voltage detecting unit comprising a differential amplifier for comparing voltage drops at either end of the passive element to be measured, so that a difference thereof can be amplified;

a current detecting unit for detecting a current vector flowing through the passive element when the sine wave is applied, said current detecting unit comprising an operational amplifier for receiving current flowing through the passive element at an inverting terminal and a resistor for feedback of a current signal output from the operational amplifier;

a phase shifter for shifting a voltage drop output from the voltage detecting unit;

a multiplying circuit unit for multiplying an output of the current detecting unit by an output of the phase shifter to calculate a phase difference between the voltage and current;

a first mean value calculating unit for calculating a mean value of the phase shifted voltage drop output from the phase shifter;

a second mean value calculating unit for calculating a mean value of the output from the current detecting unit;

a filter unit for filtering an output of the multiplying circuit unit to obtain a direct current component from the output of the multiplying circuit unit;

an analog-to-digital converter for converting the respective outputs of the first and second mean value calculating units and the output of the filter to digital signals;

a microcomputer for performing an operational process on the digital signals output from the analog-to-digital converter; and a display unit for displaying a result operationally processed at the microcomputer.

2. A measuring apparatus as defined in claim 1, wherein the phase shifter shifts by 90 degrees the sine wave of the voltage drop output from the voltage detecting unit to thereby convert the same to a cosine wave.

3. A measuring apparatus as defined in claim 2, wherein the multiplying circuit unit multiplies the signal whose phase has been shifted by 90 degrees and output from the phase shifter by a voltage signal output from the current detecting unit to thereby output a following signal which is a component related to a phase between the two signals, $G = \frac{1}{2} V_m I_m R \sin\theta - \frac{1}{2} V_m I_m R \sin(2\omega t + \theta)$.

* * * * *